United States Patent [19]

Goossen

[11] Patent Number: 5,210,428
[45] Date of Patent: May 11, 1993

[54] SEMICONDUCTOR DEVICE HAVING SHALLOW QUANTUM WELL REGION

[75] Inventor: Keith W. Goossen, Aberdeen, N.J.

[73] Assignee: AT&T Bell Laboratories, Murray Hill, N.J.

[21] Appl. No.: 786,486

[22] Filed: Nov. 1, 1991

[51] Int. Cl.$^5$ .............................................. H01L 27/14
[52] U.S. Cl. ........................................ 257/17; 257/21; 257/22; 257/185; 395/246
[58] Field of Search ...................... 357/19, 30 E, 16, 4, 357/58, 30 P, 30 R, 55, 56; 359/246, 245

[56] References Cited

U.S. PATENT DOCUMENTS

| | | | |
|---|---|---|---|
| 3,721,583 | 3/1973 | Blakeslee | 357/16 X |
| 4,088,515 | 5/1978 | Blakeslee et al. | 357/16 X |
| 4,525,687 | 6/1985 | Chemla et al. | 332/7.51 |
| 4,539,473 | 9/1985 | Brogardh et al. | 357/30 E X |
| 4,546,244 | 10/1985 | Miller | 250/211 J |
| 4,749,850 | 6/0788 | Chemla et al. | 250/211 |
| 4,841,533 | 6/1989 | Hayakawa et al. | 357/16 X |
| 4,904,859 | 2/1990 | Goossen et al. | 250/211 |
| 4,952,792 | 8/1990 | Caridi | 250/211 |
| 5,008,717 | 4/1991 | Bar-Joseph et al. | 357/16 |
| 5,034,783 | 7/1991 | Chang et al. | 357/16 |

OTHER PUBLICATIONS

Boyd et al., "33 PS Optical Switching of Symmetric Self-Electro-Optic Effect Devices," *Appl. Phys. Lett.* 57(18), 29 Oct. 1990, pp. 1843-1844.
Goossen et al., "Ecitonic Electroabsorption in Extremely Shallow Quantum Wells", *Appl. Phys. Lett.* 57(24), 10 Dec. 1990, pp. 2582-2584.
Feldman et al., "Fast Escape of Photocreated Carriers of Shallow Quantum Wells," *Appl. Phys. Lett.*, 59(4), 1 Jul. 1991, pp. 86-88.
Goossen et al., "Observation of Room-Temperature Blue Shift and Bistability in a Strained in GaAs-GaAs (III) Self-Electro-Optic Effect Device," Appl. Phys. Lett. 56(8), 19 Feb. 1990, pp. 715-717.
*Numerical Data and Functional Relationships in Science and Tech./Landolt-Bornstein*, Group III, vol. 17, Sub-vol. a, pp. 166, 234, 265, 287, 315, Springer-Verlag, New York, 1982.
D. S. Chemla ewt al., *Optical Engineering*, vol. 24, No. 4, Jul./Aug. 1985, "Nonlinear optical properties of GaAs/GaAlAs Multiple Quantum Well Material: Phenomena and Applications", pp. 556-564.
W. H. Knox et al., *Physical Rev. Letts.*, vol. 54, No. 12, Mar. 25, 1985, "Femtosecond Dynamics of Resonantly Excited Excitons in Room-Temperature GaAs Quantum Wells", pp. 1306-1309.
P. D. Swanson et al., *Appl. Phys. Lett.*, vol. 54, No. 18, May 1, 1989, "Electroabsorption in single quantum well GaAs laser structures," pp. 1716-1718.
A. M. Fox et al., AMOSA-Invited Paper, MB2, Oct. 16, 189, "Excitonic saturatoin intensity in GaAs/AlGaAs quantum well optical modulators".
E. A. Caridi et al., *Appl. Phys. Lett.*, vol. 56, No. 7, Feb. 12, 1990, "Direct demonstration of a misfit strain-generated electric field in a [111] growth axis zinc-blende heterostructure", pp. 659-661.
K. W. Goossen et al., *Appl. Phys. Lett.*, vol. 56, No. 8, Feb. 19, 1990, "Observation of room-temperature blue shift and bistability in a strained in GaAs-GaAs <111> self-electro-optic effect device", pp. 715-717.
A. M. Fox et al., *Appl. Phys. Lett.*, vol. 57, No. 22, Nov. 26, 1990, "Exciton saturation in electrically biased quantum wells", pp. 2315-2317.
K. W. Goossen et al., *Appl. Phys. Lett.*, vol. 57, No. 24, Dec. 10, 1990, "Excitonic electroabsorption in extremely shallow quantum wells", pp. 2582-2584.
J. Feldmann et al., *Appl. Phys. Lett.*, vol. 59, No. 4, Jul. 1, 1991, "Fast escape of photocreated carriers out of shallow quantum wells", pp. 86-88.

Primary Examiner—William Mintel
Attorney, Agent, or Firm—Gregory C. Ranieri

[57] ABSTRACT

Carriers are permitted escape from quantum wells within a semiconductor device in the minimum amount of time by utilizing semiconductor material in the barrier layers around the quantum well wherein the barrier layers exhibit an effective bandgap energy less than the sum of the longitudinal optical phonon energy and the exciton absorption energy.

15 Claims, 2 Drawing Sheets

SEMICONDUCTOR DEVICE HAVING SHALLOW QUANTUM WELL REGION

TECHNICAL FIELD

This invention relates to semiconductor devices and, in particular, to semiconductor devices having a quantum well region including at least one quantum well layer bounded by a barrier layer on either side of the quantum well layer.

BACKGROUND OF THE INVENTION

Semiconductor quantum well devices have been extensively studied and developed in recent years. They admit a high degree of applicability to photonic and optoelectronic circuits using tunable properties such as electro-refraction, electro-absorption, and the like. Lasers, modulators, detectors, bistable devices, and waveguides, all having quantum wells, have been designed and fabricated for such applications as optical computing, photonic switching, and optical communications.

Central to the operation of all the aforementioned quantum well devices is the fact that quantum well structures exhibit exciton resonances at room temperature. Exciton resonances are sharp absorption features near the optical band edge for the quantum well material. The existence of strong excitons which give rise to the absorption features is due to the confinement afforded by the quantum well region. Quantum wells are understood in practice as being a narrow energy bandgap material layer sandwiched between wider energy bandgap material layers wherein the thickness of the narrow energy bandgap material layer is much less than twice the exciton Bohr radius ($<<2a_0$) for the narrow energy bandgap material. In GaAs, for example, a narrow energy bandgap material layer between two wider bandgap material layers such as AlGaAs is considered a quantum well when its thickness is less than 300 Å.

In certain quantum well devices, for example, the self electrooptic effect device (SEED) defined in U.S. Pat. No. 4,546,244, it has been noted the switching speed increases as the operating light intensity increases because the quantum well region of the SEED is essentially a capacitor and is therefore charging at a rate linearly proportional to the photocurrent. Build up of photoinduced carriers in the quantum wells caused by finite carrier escape times from the quantum wells limits intensity. Intensity is limited because the exciton in the quantum well saturates at a certain carrier level which causes a degradation of the electro-absorption characteristic of the quantum well. Also, the time required for carrier escape from the quantum well increases as the applied electric field decreases across the quantum well.

In order to overcome the carrier escape problem and, thereby, promote more rapid carrier escape from the quantum wells, it was suggested in 1990 that a reduction in barrier thickness and a decrease in barrier Al concentration, x, be used to improve the saturation performance for an $Al_xGa_{1-x}As$/GaAs SEED. See *Applied Physics Letters*, Vol. 57, No. 22, pp. 2315-7 (1990). In the cited reference, the Al concentration was decreased from 0.3 to 0.2 to achieve what was stated to the most significant increase in saturation intensity. While such an apparently low Al concentration yielded a desirable decrease in carrier escape time from the quantum well, it is understood that the minimum Al concentration in the barrier layers was set at 0.2 in order to have a sufficient difference between the barrier height and the quantum well depth for maintaining exciton confinement in the quantum well layer. In a slightly earlier article in *Applied Physics Letters*, Vol. 54, No. 18, pp. 1716-8 (1989), it was stated that an Al concentration of 0.2 in an AlGaAs/GaAs quantum well structure created a "shallow well" which still maintained the necessary confinement to exhibit a coupled pair or exciton. In view of the statements in both articles, it can be surmised that sufficient exciton confinement for sharp absorption effects would not exist in quantum wells more shallow than those described above.

SUMMARY OF THE INVENTION

Carriers are permitted escape from quantum wells within a semiconductor device in the minimum amount of time by utilizing semiconductor material in the barrier layers around the quantum well wherein the barrier layers exhibit an effective bandgap energy less than the sum of the longitudinal optical phonon energy and the exciton absorption energy. In such an embodiment, the quantum well is said to be shallow. For $Al_xGa_{1-x}As$/GaAs semiconductor quantum well devices, this relationship corresponds to a device having barrier layers whose Al concentration is given as $0.005 < x \leq 0.04$. In the latter devices, a strong exciton indicative of sufficient exciton confinement in the shallow quantum well is exhibited while saturation intensities equivalent to bulk GaAs are achieved.

In one embodiment, the semiconductor quantum well device is a self electrooptic effect device having shallow quantum wells. By utilizing the shallow quantum wells, the self electrooptic effect device provides not only strong excitonic electro-absorption but also a fast rate for carrier escape or carrier sweep-out at relatively small bias potentials which, in turn, results in reduced switching time for the device.

BRIEF DESCRIPTION OF THE DRAWING

A more complete understanding of the invention may be obtained by reading the following description of specific illustrative embodiments of the invention in conjunction with the appended drawing in which.

Figure 1:
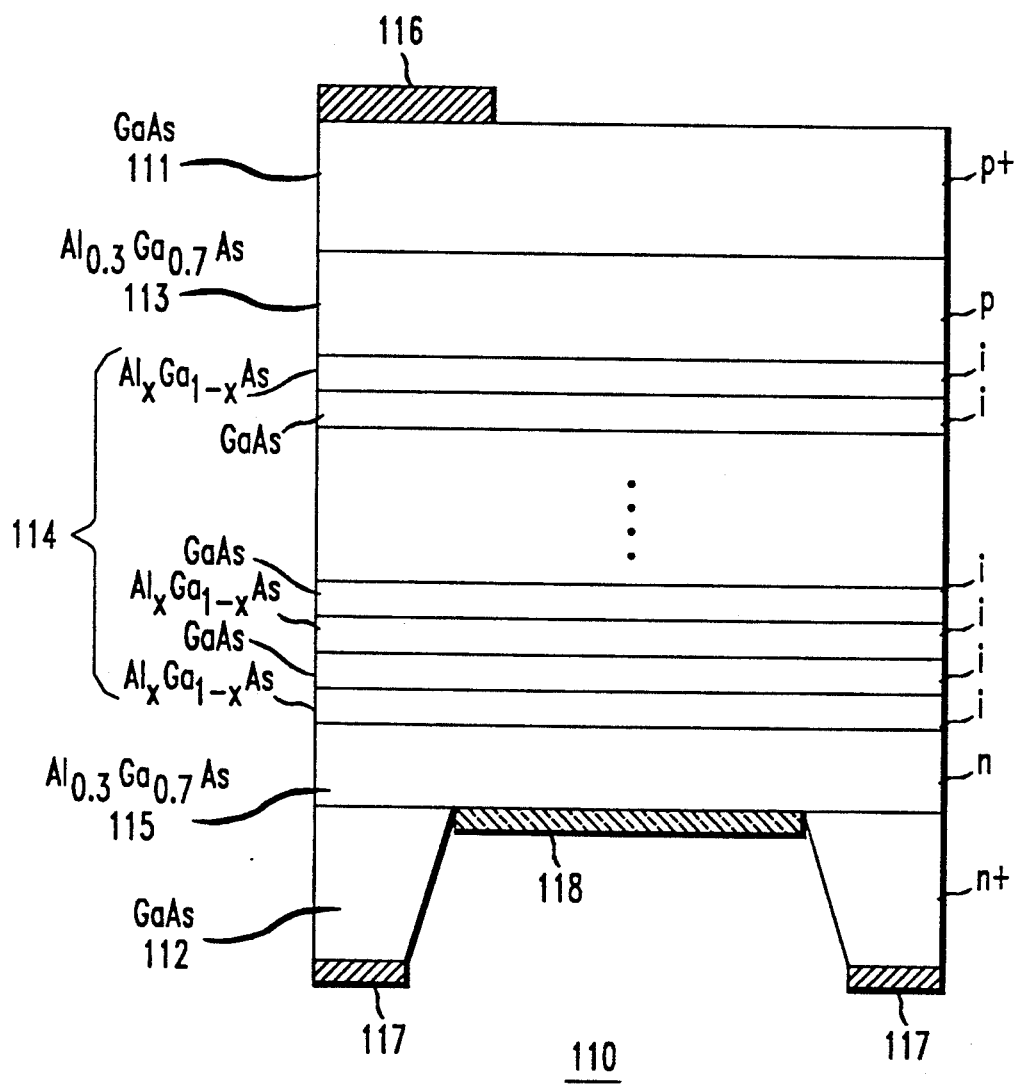
FIG. 1 shows a cross sectional view of a p-i-n quantum well heterostructure device realized in accordance with the principles of this invention.

The various exemplary embodiments of the invention shown in the FIGS. have not been drawn to scale and are provided merely for purposes of illustration and not limitation. Exemplary dimensions of the semiconductor layers shown in the FIGS. are stated in the following description.

DETAILED DESCRIPTION

Quantum well regions are formed in a variety of semiconductor devices such as lasers, waveguides, detectors, modulators, and the like. The present invention applies to the quantum well region of a semiconductor device and is shown herein in the exemplary embodiments of a p-i-n device used primarily for photodetection and optical modulation and a self electrooptic device (SEED) for optical switching applications. The exemplary embodiments are given for purposes of illustration and not for purposes of limitation.

As described above, quantum wells require a depth sufficient to confine the coupled electron-hole pair as an exciton. But as depth of the well increases, the difficulty for carriers to escape the well increases. Even though the prior art suggested a reduction of the quantum well depth to improve carrier escape rates, the same prior art limited their investigations to quantum wells which were relatively deep and suffered from relatively slow carrier escape rates which, in the case of SEEDs, unduly limited the switching speed. In accordance with the present invention, very shallow quantum wells have been realized and have exhibited all effects associated with strong exciton confinement. Moreover, since these quantum wells are shallow, carrier escape rates from the quantum wells are faster than in the prior art and approach the carrier transit characteristics in bulk semiconductor material.

It has now been recognized that a shallow quantum well is realizable in any semiconductor material system such as the Group III–V semiconductor materials. The shallow quantum well is formed both by making the quantum well layer from semiconductor material or materials having one effective bandgap energy, $E_g$ (quantum well), and by making the barrier layers from semiconductor material or materials having a different effective bandgap energy, $E_g$ (barrier), so that the effective bandgap energy of the barrier layers is less than the sum of the longitudinal optical phonon energy $\omega_{LO}$ and the exciton absorption energy $E_B$.

It has been found that the exciton absorption energy is approximated roughly as the average of the effective bandgap energies of the barrier and the quantum well layers, that is, $$E_B \approx \frac{E_g(\text{barrier}) + E_g(\text{quantum well})}{2}.$$

The difference between the exciton absorption energy and the energy bandgap of the barrier layer is the excitonic work function.

Effective bandgap energies for the barrier and quantum wells are the average bandgap energies weighted over the thickness of each particular layer. The effective bandgap energy is used to account for variations of the actual bandgap energy as the layer is traversed from one side to the opposite side.

Longitudinal optical (LO) phonons are lattice vibrations at a particular energy level for each semiconductor material. The LO phonons have sufficient energy to break apart excitons as a result of ionization. The LO phonon energy is classified as a lattice property for various semiconductor materials in "Numerical Data and Functional Relationships in Science and Technology", Vol. 17a (Springer-Verlag: New York (1982).

The physical carrier escape mechanism from the shallow quantum wells is understood as follows. Carriers can be efficiently scattered to unconfined continuum states by absorption of LO phonons if the excitonic work function is less than the LO phonon energy.

For shallow GaAs/AlGaAs quantum wells realized in accordance with the principles of this invention, absorption of the LO phonon by an exciton in the quantum well has been measured to take approximately 300 femtoseconds. This amount of time is much shorter than any absorption time previously measured in p-i-n quantum well modulators. When an LO phonon is absorbed by an exciton in a GaAs quantum well, the energy imparts to the exciton is approximately 36 meV. In practice, it has been determined that this amount of energy is sufficient to raise confined carriers above the barrier adjacent to the well when the Al concentration in the AlGaAs barriers is less than or equal to 0.04.

A p-i-n diode structure realized in accordance with the principles of this invention is shown in FIG. 1 in a cross-sectional representation. An approximate energy band diagram for the quantum well region of the device shown in FIG. 1 is given in FIG. 3 where corresponding locations for the different barrier layers and quantum well layers of the intrinsic region of the device are shown at the bottom of the figure. It should be noted that the figures have not been drawn to scale in order to improve the understanding of the principles of the present invention.

As shown in FIG. 1, the exemplary p-i-n diode is epitaxially grown by gas source molecular beam epitaxy on substrate layer 112. Substrate layer 112 is composed of substantially n+ GaAs. Silicon doped AlGaAs having an Al concentration $x = 0.3$ is utilized to form n-type contact layer 115 to a thickness of 1.5 $\mu$m with a doping concentration of $2 \times 10^{18}$cm$^{-3}$. Intrinsic region 114 of the p-i-n diode comprises AlGaAs barrier layers 114-1 and GaAs quantum well layer 114-2. Barrier layers 114-1 are substantially undoped or intrinsic AlGaAs having an Al concentration in the range 0.005 is less than $x \leq 0.04$ and grown to a thickness of approximately 100 Å. The Al concentration in the barrier layers 114-1 is chosen to form shallow quantum wells in accordance with the principles of this invention. Quantum well layers 114-2 are substantially undoped or intrinsic GaAs grown to a thickness of approximately 100 Å. Beryllium doped AlGaAs having an Al concentration of 0.3 is used to form p-type contact layer 113 at a thickness of approximately 0.6 $\mu$m with a dopant concentration of $2 \times 10^{18}$cm$^{-3}$. Finally, a thin p+ GaAs cap layer 111 is grown to a thickness of approximately 50 Å. In the intrinsic quantum well region, the embodiments shown in FIG. 1 includes 50 periods of quantum well and barrier layers for a total thickness of approximately 1 $\mu$m. Quantum wells were grown at 600° C. Diode mesas were etched to a size of 200 $\mu$m square. Gold contact 116 was made to cap layer 111. Metallic contacts 117 were formed on the doped substrate and the substrate was etched down to layer 115 to form a window for light transmission. Antireflection coating 118 was applied to the exposed portion of layer 115. It should be noted that the thickness of the narrow bandgap GaAs layer 111 is sufficiently small to avoid any significant perturbation or absorption of incident light beams. Thicknesses for the layers outside the intrinsic quantum well region may be reduced significantly in order to improve transmission of optical signals to the quantum well layer.

Standard wet chemical etching techniques are employed to form mesa diodes as shown in FIG. 1. Ohmic contacts for such diodes are formed by standard techniques including evaporative and alloying of metals. For the example shown in FIG. 1, contact 117 is formed as a ring contact on the isolated n layer by using an alloyed stack comprising layers of gold, nickel, and gold-germanium. Contact 116 can be formed as a ring or area contact on layer 111 using an alloyed stack comprising layers of gold, gold-zinc and chromium.

Figure 3:
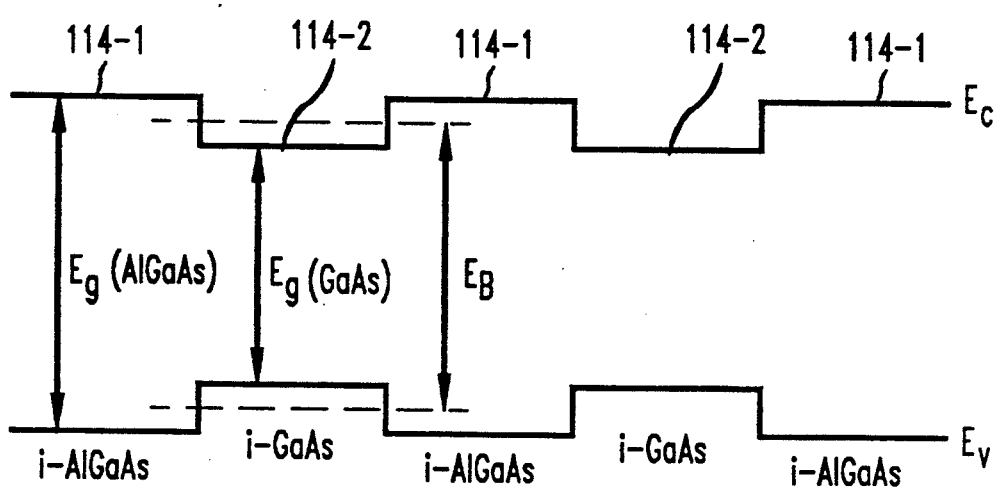
FIG. 3 shows an exemplary band structure for the intrinsic quantum well region of the p-i-n device from FIG. 1.

As shown in FIG. 3, the conduction band $E_c$ and the valence band $E_v$ are drawn for a portion of the intrinsic quantum region of the device shown in FIG. 1. Also shown in FIG. 3 are the bandgap energies for the barrier and quantum well layers as well as the exciton absorption energy $E_B$.

In contrast with the deeper AlGaAs/GaAs quantum wells where the Al concentration is $x=0.2$ and where the carrier sweep out rates decrease with decreasing electric field, the shallow AlGaAs/GaAs quantum wells with $x=0.02$ or $0.04$, approximately one order of magnitude less Al concentration, exhibit carrier sweep out rates which are fast and determined almost entirely by the saturated drift velocity even for small forward bias potentials. This means that, for the shallow wells, the carrier escape is not a limiting factor for their sweep out of the intrinsic region. Of course, the electroabsorption of the shallow wells remains strong.

Figure 2:
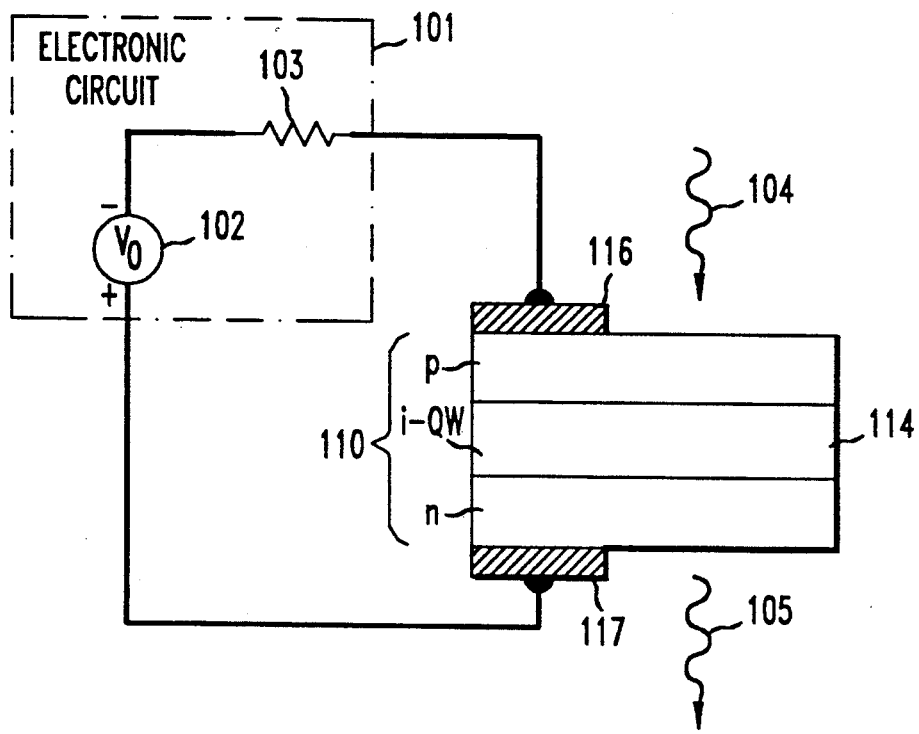
FIG. 2 shows a self electrooptic effect device incorporating the p-i-n device from FIG. 1.

An optically bistable self electrooptic device (SEED) as shown in FIG. 2 generally comprises the interconnection of a p-i-n diode as shown in FIG. 1 having an intrinsic quantum well region, an electrical or electronic load, and a bias voltage supply. The load and bias voltage supply are arranged in a feedback loop around the diode usually in a reverse bias configuration. In SEED device, optical bistability relies on incorporating semiconductor material whose absorption increases with increased excitation of the incorporated material. See U.S. Pat. No. 4,546,244.

When an electric field is applied perpendicular to the quantum well layers to permit electroabsorption by the quantum-confined Stark effect (QCSE), the absorption band edge including any sharp exciton resonance peaks is shifted to lower photon energies to achieve transmission changes of approximately 50%. Because the absorption edge is shifted toward lower photon energy under applied field conditions, the device is called a "red shift" device owing to the lower photon energy of red light in the visible light spectrum. It should be noted that SEED devices having a "blue shift" property have been described in U.S. Pat. Nos. 4,952,792 and 4,904,859. Interband transitions give rise to a substantial amount of absorption for the biased SEED device. In general, the contrast between the low and high absorption states of the device is sufficient to permit realization of useful devices for modulation and the like.

With low optical power incident on the SEED device, nearly all the bias voltage is dropped across the diode because there is negligible, if any, photocurrent. The wavelength of light incident on the photodiode is carefully selected to be at or near the exciton resonance wavelength at zero applied field for peak or maximum absorption of the light. As incident light impinges on the reverse biased p-i-n diode, an increasing photocurrent is generated to, in turn, reduce the voltage across the diode by increasing the voltage drop across the load. The reduced voltage permits increased absorption to occur as the exciton resonance peak shifts back toward its zero applied field wavelength. Increased absorption provides a further increased photocurrent which, under proper regenerative feedback conditions, yields device switching.

Optically bistable SEED devices have been developed and reported in the prior art to operate in accordance with the principles set forth above. These devices have exhibited room temperature operation at high speed and low switching energy despite the lack of a resonant optical cavity which is commonly used to reduce switching energy. Moreover, such devices have been characterized by quantum well regions employing symmetric quantum wells. Symmetric quantum wells such as shown in FIG. 3 are known to produce the desired band edge absorption shift (a red shift) under applied field conditions so that increased absorption of incident light leads to switching necessary for bistable device operation.

FIG. 2 shows a schematic diagram of a self electrooptic effect device comprising a p-i-n diode having an intrinsic quantum well region in accordance with the principles of the invention. Light beam 104 impinges on semiconductor device 110. A fraction of light beam 104 emerges from semiconductor device 110 as light beam 105. Semiconductor device 110 is biased by electronic circuit 101. For the example shown in FIG. 2, electronic circuit 101 includes reverse-bias voltage $V_0$ from bias voltage supply 102 connected in series with resistor 103 and semiconductor device 110.

Electronic circuit 101 may include a number of other components such as transistors, phototransistors and the like in series or parallel combination with a proper voltage or current supply. Realizations of electronic circuit 101 are shown throughout U.S. Pat. No. 4,546,244. These realizations are incorporated herein expressly by reference.

The optical characteristics of semiconductor device 110 for the former self electrooptic device of the '244 patent are such that an increasing light intensity from input beam 104 leads to an increasing absorption coefficient by semiconductor device 110. Interconnection with electronic circuit 101 provides a positive feedback mechanism to permit increasing optical absorption of light energy by semiconductor device 110 to lead to an increased optical absorption coefficient. It should be noted that when reference is made to the optical absorption coefficient it is also understood to encompass a reference in the alternative to the index of refraction because changes in the absorption spectrum also result in changes to the index of refraction as described in the Kramers-Kronig relationship. For a semiconductor device 110 operating in accordance with the principles of the present invention, semiconductor device 110 is capable of operating at higher speeds and faster switching rates because it has a higher saturation intensity. This results from the shallow quantum wells which permit faster carrier escape rates for carriers in the quantum wells.

Generally, the electrical contact pads are standard ring contacts to permit a clear optical path for ingress and egress of light beams with respect to the semiconductor device and, more importantly, the quantum well region. Semiconductor device 110 includes a p-i-n structure such as described with respect to FIGS. 1 and 3. It is contemplated that quantum well region 114 include one or more quantum well layers of narrow bandgap semiconductor material bounded on either side by a barrier layer of wider bandgap semiconductor material.

Semiconductor device 110 may be fabricated by standard epitaxial processing techniques including molecular beam epitaxy and vapor phase epitaxy such as metal organic chemical vapor deposition. Fabrication techniques including semiconductor layer growth, impurity doping, photolithography and contact metallization to realize a device in accordance with the principles of the invention described above are believed to be well known to those persons of ordinary skill in the art.

Other configurations of the device 110 are contemplated within the spirit and scope of the present invention. For example, it is understood that the present invention is extensible to devices in which the resistor is integrated with the p-i-n diode. Also, a compound p-n-p-i-n structure is contemplated in which the p-n diode forms the photodiode and the p-i-n structure is the integrated modulator including the asymmetric quantum well region. It is further understood that the use of asymmetric quantum well regions is contemplated for all forms of self electrooptic effect devices such as the symmetric SEED and the asymmetric SEED.

It is understood that, while the material system GaAs/AlGaAs is described above for fabricating the electrically controlled semiconductor device having cascaded modulation-doped semiconductor heterostructures, other material combinations may be selected from other semiconductor Group III-V systems such as GaAs/InGaAs, InGaAs/InGaAlAs, InGaAs/InAlAs, GaAs/AlAs, GaAsSb/GaAlAsSb and InGaAsP/InP. In these semiconductor systems, the layers may be lattice-matched to suitable GaAs or InP substrates. Mismatching is also contemplated wherein strained layers are grown over the substrate material. Finally, extension of the device structures is also contemplated to semiconductor compounds in Group II-VI and Group IV.

What is claimed is:

1. A semiconductor device comprising a quantum well region including first and second barrier layers and a quantum well layer positioned between the first and second barrier layers, the first and second barrier layers comprising wide bandgap semiconductor material and the quantum well layer comprising narrow bandgap semiconductor material so that the first and second barrier layers exhibit an effective bandgap energy greater than the effective bandgap energy of the quantum well layer, said quantum well region exhibiting an exciton absorption energy and a longitudinal optical phonon energy, wherein the improvement comprises each of the first and second barrier layers having their respective effective bandgap energy less than the sum of the longitudinal optical phonon energy and the exciton absorption energy.

2. The semiconductor device as defined in claim 1 wherein the wide bandgap semiconductor material includes $Al_xGa_{1-x}As$ and the narrow bandgap semiconductor material includes GaAs.

3. The semiconductor device as defined in claim 1 wherein Al concentration x is in the range $0.005 < x \leq 0.04$.

4. The semiconductor device as defined in claim 1 wherein the wide bandgap semiconductor material includes $Al_xGa_{1-x}As$ and the narrow bandgap semiconductor material includes $Al_yGa_{1-y}As$ where $x > y$ and $0 \leq x, y \leq 1.0$.

5. The semiconductor device as defined in claim 1 wherein the wide bandgap semiconductor material includes GaAs and the narrow bandgap semiconductor material includes InGaAs.

6. The semiconductor device as defined in claim 1 wherein the wide bandgap semiconductor material includes InAlGaAs and the narrow bandgap semiconductor material includes InGaAs.

7. The semiconductor device as defined in claim 1 wherein the wide bandgap semiconductor material includes InGaAsP and the narrow bandgap semiconductor material includes InP.

8. A semiconductor device grown on a semiconductor substrate comprising an n-type conductivity region, an intrinsic quantum well region, and a p-type conductivity region, the intrinsic quantum well region including first and second barrier layers and a quantum well layer positioned between the first and second barrier layers, the first and second barrier layers comprising wide bandgap semiconductor material and the quantum well layer comprising narrow bandgap semiconductor material so that the first and second barrier layers exhibit an effective bandgap energy greater than the effective bandgap energy of the quantum well layer, said quantum well region exhibiting an exciton absorption energy and a longitudinal optical phonon energy, wherein the improvement comprises each of the first and second barrier layers having their respective effective bandgap energy less than the sum of the longitudinal optical phonon energy and the exciton absorption energy.

9. The semiconductor device as defined in claim 8 wherein the wide bandgap semiconductor material includes $Al_xGa_{1-x}As$ and the narrow bandgap semiconductor material includes GaAs.

10. The semiconductor device as defined in claim 9 wherein Al concentration x is in the range $0.005 < x \leq 0.04$.

11. The semiconductor device as defined in claim 8 wherein the wide bandgap semiconductor material includes $Al_xGa_{1-x}As$ and the narrow bandgap semiconductor material includes $Al_yGa_{1-y}As$ where $x > y$ and $0 \leq x, y \leq 1.0$.

12. The semiconductor device as defined in claim 8 wherein the wide bandgap semiconductor material includes GaAs and the narrow bandgap semiconductor material includes InGaAs.

13. The semiconductor device as defined in claim 8 wherein the wide bandgap semiconductor material includes InAlGaAs and the narrow bandgap semiconductor material includes InGaAs.

14. The semiconductor device as defined in claim 8 wherein the wide bandgap semiconductor material includes InGaAsP and the narrow bandgap semiconductor material includes InP.

15. An optical device comprising:
means responsive to light for generating a photocurrent;
a structure having a semiconductor quantum well region; and
means responsive to the photocurrent for electrically controlling an optical absorption of the semiconductor quantum well region in order to cause the optical absorption to vary in response to variations on the photocurrent;
the optical device being characterized in that, the semiconductor quantum well region includes first and second barrier layers and a quantum well layer positioned between the first and second barrier layers, the first and second barrier layers comprising wide bandgap semiconductor material and the quantum well layer comprising narrow bandgap semiconductor material so that the first and second barrier layers exhibit an effective bandgap energy greater than the effective bandgap energy of the quantum well layer, said quantum well region exhibiting an exciton absorption energy and a longitudinal optical phonon energy, and each of the first and second barrier layers having their respective effective bandgap energy less than the sum of the longitudinal optical phonon energy and the exciton absorption energy.

* * * * *